United States Patent
Lin et al.

(10) Patent No.: US 6,576,558 B1
(45) Date of Patent: Jun. 10, 2003

(54) HIGH ASPECT RATIO SHALLOW TRENCH USING SILICON IMPLANTED OXIDE

(75) Inventors: Chrong-Jung Lin, Taipei (TW); Hsin-Ming Chen, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/262,999

(22) Filed: Oct. 2, 2002

(51) Int. Cl.[7] .............................................. H01L 21/302
(52) U.S. Cl. ........................ 438/700; 438/719; 438/692; 438/704; 438/717; 438/435; 438/424; 438/437
(58) Field of Search ................................ 438/705, 694, 438/700, 717, 692, 704, 714, 719, 723, 724, 736, 435, 424, 437

(56) References Cited

U.S. PATENT DOCUMENTS

| | | | |
|---|---|---|---|
| 5,393,693 A | * | 2/1995 | Ko et al. ...................... 437/69 |
| 5,670,388 A | * | 9/1997 | Machesney et al. .......... 437/21 |
| 5,783,476 A | * | 7/1998 | Arnold ........................ 438/425 |
| 5,807,784 A | * | 9/1998 | Kim ............................ 438/423 |
| 6,127,242 A | * | 10/2000 | Batra et al. .................. 438/440 |
| 6,335,259 B1 | * | 1/2002 | Jeng ............................ 438/424 |
| 6,432,798 B1 | * | 8/2002 | Liu et al. ..................... 438/433 |

* cited by examiner

Primary Examiner—George Goudreau
(74) Attorney, Agent, or Firm—George O. Saile; Stephen B. Ackerman

(57) ABSTRACT

A trench is etched through the layers of pad oxide and silicon nitride that have been deposited on a substrate, the patterned layer of photoresist is left in place. A tilt angle nitrogen implant is performed into the surface of the substrate, a deep shallow STI trench is etched into the surface of the substrate. An oxygen implant of moderate intensity is performed in the created STI trench, the photoresist is removed. An anneal is performed on the implanted oxygen. A liner oxide is grown within the opening, High Density Plasma (HDP) oxide is deposited inside the opening and the top surface of the remaining silicon oxide. CMP is performed to the surface of the HDP oxide down to the surface of the pad oxide that completes the formation of the STI region under the first embodiment of the invention. The invention can be further extended by creating a LOCOS layer at the bottom of the STI opening or by further etching the bottom of the STI opening. Both extensions are to be implemented prior to growing the oxide liner.

16 Claims, 4 Drawing Sheets

HIGH ASPECT RATIO SHALLOW TRENCH USING SILICON IMPLANTED OXIDE

BACKGROUND OF THE INVENTION (1) Field of the Invention

The invention relates to the fabrication of integrated circuit devices, and more particularly, to a method of creating Shallow Trench Isolation in regions of sub-micron device feature sizes.

(2) Description of the Prior Art

In fabricating semiconductor devices, typically in the surface of semiconductor substrates, many different disciplines of the art are applied. These disciplines are directed at creating particular features within the device. The combination of the device features form the finished device that has been designed and fabricated to perform a particular function and as such is referred to as an active device. Areas within the surface of the substrate that are dedicated to the formation of separate functions must electrically be isolated from each other, this has given rise to a range of methods that implement electrical insulation between device features and devices within a semiconductor die.

The continuing trend in the semiconductor industry is to form semiconductor devices on silicon substrates that have increasingly higher device densities and smaller device feature sizes. This continued device shrinkage and increased device density brings with it new problems, in particular one such problem relates to the necessity of providing an efficient and reliable process to separate active devices that function on the current miniaturized scale. For the Very Large Scale Integration (VLSI) and Ultra Large Scale Integration (ULSI) technologies, minimum device feature size of 0.25 um. is being approached. In the fabrication of such integrated circuits one of the most favorite dielectric isolation schemes by which one region of the semiconductor substrate is electrically isolated from another region is the Shallow Trench Isolation (STI).

One other method that has previously been used to create isolatio regions is the so-called "Local Oxidation of Silicon". (LOCOS) process. The LOCOS process is frequently used to form CMOS gate structures. For this LOCOS process, a temporary patterned nitride layer is used as a protection or resistant area to cover the future active areas during the subsequent field oxidation process. The LOCOS process can further briefly be described as follows: a pad oxide is formed on the surface of a silicon substrate, a layer of silicon f($Si_3N_4$) is deposited over the layer of pad oxide. The pad oxide is thin thermal oxide that allows better adhesion between the nitride and silicon and acts as a stress relaxation layer during field oxidation. The;nitride and oxide layers are patterned and etched thereby creating openings exposing,those portions of the silicon substrate where the local oxidation is to be formed. A boron channel stop layer is ion implanted into the isolation regions (of the CMOS device). The field oxide is grown within the openings and the nitride and the pad oxide layers are removed. This completes the local oxidation. A disadvantage of the LOCOS process is that the process requires long oxidation times (thermal budget) and that lateral oxidation under the barrier mask ("bird's beak encroachment") limits the minimum spacing between adjacent active device areas to about the 1 um range. This prevents further increases in device packaging density using the LOCOS process.

One method of circumventing the LOCOS limitations and to further reduce the field oxide (FOX) minimum feature size is to use shallow trench isolation (STI).

In using the STI approach for the VLSI technology, deep trenches are typically made in the substrate by reactive ion etching. The trenches are typically about 5–6 um. deep, about 2–3 um. wide and spaced about 2.5.–3.5 um. apart from another trench. The ULSI technology requires trenches that are deeper and spaced closer together posing new problems of field turn-on, punchthrough, gap-fill within the trenches and others. STI's can be made using, for instance, Buried Oxide (BOX) isolation for the shallow trenches. The method involves filling the trenches with a chemical vapor deposition (CVD) silicon oxide ($SiO_2$) and then etching back or mechanically/chemically polishing the $SiO_2$ to yield a planar surface. The shallow trenches etched for the BOX process are anisotropically plasma etched into the silicon substrate and are, for ULSI applications, typically between 0.5 and 0.8 micrometer (um.) deep. STI are formed around the active device to a depth between 4000 and 20000 Angstrom.

Following the forming of the trenches they are filled with a suitable dielectric material such as oxide, polysilicon or an organic polymeric material, for example polyimide. While the dielectric-filled trench isolation can provide effective dielectric isolation between devices, the fundamental disadvantage of this scheme is that the resulting structure tends to be non-planar. This lack of planarity is mainly due to the difference in the amount of fill that is required to fill a multiplicity of closely spaced trenches and the dielectric that is deposited on the surface of the substrate. This effect is further aggravated by the steps of bake and cure that are applied to the deposited dielectric in order to cure the dielectric and to evaporate the solvents from the dielectric. Further problems can be caused in this respect by the fact that in many chip designs there can be a significant difference in device density across the chip. In the design of memory chips for instance, the memory functions of the chip can consist of 10.000 or more memory elements. These memory elements are surrounded by their supporting logic functions which tend to have considerably lower density of active elements thereby further aggravating the problems of even distribution of the deposited dielectric across the surface of the chip and of obtaining good planarization for the entire surface of the chip. It is clear that poor planarity across the surface of the trenches leads to further problems in creating interconnect patterns and in depositing overlying layers of insulation and metalization. These overlying layers of metalization must be patterned and etched, a typically photolithographic process that requires constant and low depth of focus. Where this depth of focus is not as required, wire patterns of poor quality are created resulting a serious yield detractors and concerns of device reliability.

Another problem associated with the formation of STI regions is that if the silicon oxide is etched or polished to the surface of the silicon substrate, dishing occurs in the surface of the silicon oxide resulting in a concave surface of the STI regions. This results in recesses in the field oxide at the edge of the device areas. Later, when the gate electrodes are made for the FET's, the gate electrodes extend over the device area edge, causing an undesirable lower and variable threshold voltage when the devices are completed. It is therefore desirable to make isolation areas that extend higher than the substrate surface to avoid this problem while reducing manufacturing costs.

It must further be observed that recent requirements for the creation of holes within deep layers of either conducting or other materials have resulted in creating openings that have aspect ratios in excess of 3. It is beyond the capability of the existing techniques to fill gaps of this aspect ratio with High Density Plasma-oxide (HDP-oxide). This lack of adequate filling of gaps also occurs for holes that have a reentrant spacer profile. A reentrant spacer profile is a profile where the walls of the openings are not vertical but are sloped; this sloping of the walls makes complete penetration of the HPD-oxide into the hole difficult and, under certain conditions, incomplete.

As a consequence of incomplete deposition of HDP-oxide into high aspect ratio holes, keyholes or deposition irregularities will be formed. These keyholes or deposition irregularities are characterized by non-homogeneous deposition that form in the deposited HDP-oxide.

The indicated condition for the formation of a keyhole can also occur where a high aspect ratio through-hole is formed by RIE and where the formation position of the through-hole may deviate from the correct position due to mask misalignment or a process variation. The created through-hole can in this case exhibit a profile that inhibits complete and uniform deposition of HDP-oxide.

U.S. Pat. No. 5,783,476 (Arnold) shows a method comprising: form STI using 1) an O2 I/I into the trench, see FIG. 4, see Col. 3; 2) anneal to form SiO2, see Col. 3, line 47 and 3) trench fill with HPD oxide, see Col. 4, line 18. Arnold is close to the invention, see broad claim 1.

U.S. Pat. No. 5,807,784 (Kim) shows method comprising: form STI using 1) a O2 I/I into the trench; 2) anneal to form SiO2 and 3) trench fill with oxide. See claim 1, this is close.

U.S. Pat. No. 5,393,693 (Ko et al.) shows an isolation process using an O2 implant.

U.S. Pat. No. 5,670,388 (Machesney et al.) shows a SIMOX implant under a FET.

SUMMARY OF THE INVENTION

A principle objective of the invention is to provide a method of creating a high aspect ratio STI region while avoiding problems of gap fill and the occurrence of voids within the gap.

Another objective of the invention is to reduce the spacing between adjacent STI regions.

Yet another objective of the invention is to improve STI punchthrough immunity.

Yet another objective of the invention is to improve STI field turn-on/turn-off characteristics.

Yet another objective of the invention is to increase the STI junction breakdown voltage value.

Yet another objective of the invention is to avoid trench bottom corner damage in the STI opening.

In accordance with the objectives of the invention a new method is provided to create STI regions.

Under the first embodiment of the invention, a layer of pad oxide is deposited over the surface of the substrate; a layer of silicon nitride is deposited over the layer of pad oxide. The layers of pad oxide and silicon nitride are patterned and etched over the region where the STI is to be created, the (silicon) substrate is subjected to a tilt angle nitrogen implant that is self aligned with the opening that has been etched through the layers of silicon nitride and pad oxide. A deep shallow trench is now etched into the substrate; the patterned layer of photoresist is left in place. A tilt oxygen implant of moderate intensity is performed in the created opening, the photoresist is removed. An anneal is performed on the implanted oxygen. A liner oxide is grown within the opening, High Density Plasma (HDP) oxide is deposited inside the opening and on the surface of the remaining silicon nitride. CMP is performed to the surface of the HDP oxide down to the surface of the silicon nitride. After removing the silicon nitride and pad oxide, the STI region is completed under the first embodiment of the invention.

Under the second embodiment of the invention, a layer of pad oxide is deposited over the surface of the substrate; a layer of silicon nitride is deposited over the layer of pad oxide. The layers of pad oxide and silicon nitride are patterned and etched over the region where the STI is to be created, the (silicon) substrate is subjected to a tilt angle nitrogen implant that is self aligned with the opening that has been etched through the layers of silicon nitride and pad oxide. A deep shallow trench is now etched into the substrate; the patterned layer of photoresist is left in place. An oxygen implant of moderate intensity is performed in the created opening, the photoresist is removed. An anneal is performed on the implanted oxygen. A liner oxide is grown within the opening; the bottom of the created opening is now subjected to an oxidation process creating a layer of LOCOS on the bottom of the STI region. High Density Plasma (HDP) oxide is deposited inside the opening and the top surface of the remaining silicon oxide and silicon nitride. CMP is performed to the surface of the HDP oxide down to the surface of the silicon nitride. After the removal of the silicon nitride and the pad oxide has been completed, the STI region is completed under the second embodiment of the invention.

Under the third embodiment of the invention, a layer of pad oxide is deposited over the surface of the substrate; a layer of silicon nitride is deposited over the layer of pad oxide. The layers of pad oxide and silicon nitride are patterned and etched over the region where the STI is to be created, the (silicon) substrate is subjected to a tilt angle nitrogen implant that is self aligned with the opening that has been etched through the layers of silicon nitride and pad oxide. A deep shallow trench is now etched into the substrate; the patterned layer of photoresist is left in place. An oxygen implant of moderate intensity is performed in the created opening, the photoresist is removed. An anneal is performed on the implanted oxygen, the bottom of the opening is removed further increasing the depth of the opening while leaving spacers on the sidewalls of the opening. A liner oxide is grown within the opening followed by blanket High-Density Plasma (HDP) deposition of oxide. CMP is performed to the surface of the HDP oxide down to the surface of the pad oxide, which completes the formation of the STI region under the third embodiment of the invention.

BRIEF DESCRIPTION OF THE DRAWINGS

FIG. 1 shows a cross section of the substrate after deposition of a layer of pad oxide, silicon nitride and the etching of an opening in these layers above the region where the STI is to be formed. A tilt angle nitrogen implant is performed into the substrate. FIG. 1 shows a cross section of the STI with patterned layers of pad-oxide, silicon nitride and photoresist.

FIG. 2 shows the process of oxygen ion implant into the silicon substrate.

FIG. 3 shows the cross section of the STI after the pattern of photoresist has been removed.

FIG. 4 shows a cross section of the STI after the anneal of the silicon Implanted Oxide on the sidewalls of the STI opening.

FIG. 5 shows a cross section of the STI region after growth of a layer of liner oxide and the blanket deposition of HDP oxide.

FIG. 6 shows a cross section of the completed STI of the first embodiment of the invention.

DESCRIPTION OF THE PREFERRED EMBODIMENTS

Figure 1:
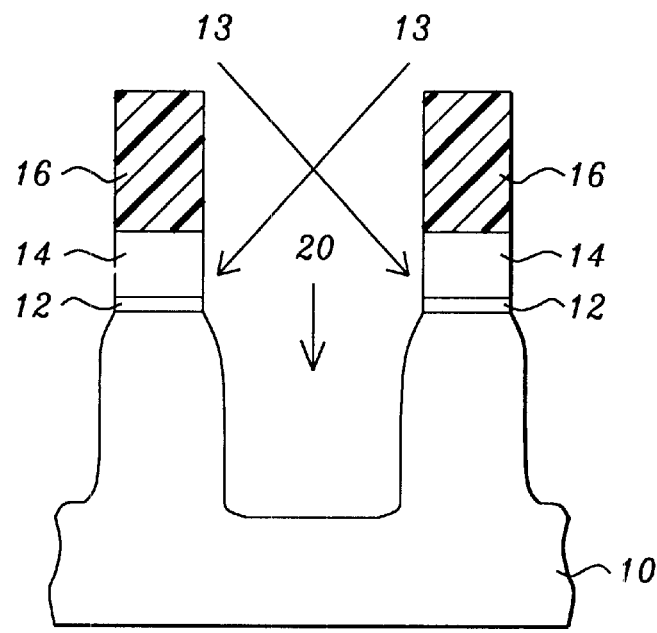
FIGS. 1 through 6 address the first embodiment of the invention, as follows.

Referring now specifically to FIG. 1, there is shown a cross section of the semiconductor substrate 10 over which a layer 12 of pad oxide has been deposited. A layer 14 of silicon nitride has been deposited over the layer 12 of pad oxide. A layer 16 of photoresist has been deposited, exposed using photolithography and etched to form trenches in the layers 12 and 14, these trenches are above and aligned with the region of the silicon substrate 10 where the STI is to be formed.

The pad oxide is a thin thermal oxide that allows better adhesion between the nitride and silicon and acts as a stress relaxation layer during field oxidation. Pad oxide can be formed to a thickness of about 110 Angstrom through a thermal oxidation method at a temperature of about 920 degrees C. for a time period of about 480 minutes. Layer 12 of pad oxide should, as a rule of thumb, be of a minimum thickness that is at least one third the thickness of the silicon nitride layer 14.

Layer 12 of pad oxide can be etched using for instance reactive ion etching using $Ar/CF_4$ as an etchant at a temperature of between about 120 and 160 degrees C. and a pressure of between about 0.30 and 0.40 Torr for a time of between about 33 and 39 seconds using a dry etch process.

A layer of silicon nitride is typically deposited using LPCVD or PECVD procedures, at a temperature between about 200 and 800 degrees C., to a thickness between about 200 and 5000 Angstrom employing silane as a silicon source material and ammonia as a nitrogen source material. The layer of silicon nitride can be anisotropically etched with a plasma gas containing carbon tetrafluoride ($CF_4$) containing fluorine ions, in a commercial etcher such as a parallel plate RIE apparatus or an electron cyclotron resonance (ECR) plasma reactor. Layer 14 of silicon nitride can also be etched using $He/NF_3$ as an etchant at a temperature of between about 80 and 100 degrees C. and a pressure of about 1.20 and 1.30 Torr for a time of between about 20 and 30 seconds using a dry etch process.

A tilt angle nitrogen implant 13 into the surface of the silicon substrate 10, this implant is performed under an angle of between about 15 and 45 degrees with the plane of the surface of the substrate and is an implant of nitrogen with a dose of between about 1E14 and 1E15 atoms/cm$^2$ and an energy between about 25 and 40 KeV.

FIG. 1 further shows a cross section of an STI opening 20 that has been formed in the surface of a silicon substrate 10. The process of creating the STI opening is performed mainly by plasma etching. Basically, in plasma etching as used in the manufacturing of silicon integrated devices, a silicon wafer on whose surface has been deposited various layers, is positioned on a first electrode in a chamber that also includes a second electrode spaced opposite the first. As a gaseous medium that consists of one or more gasses is flowed through the chamber, an r-f voltage, which may include components at different frequencies, is applied between the two electrodes to create a discharge that ionizes the gaseous medium and that forms a plasma that etches the wafer. By appropriate choice of the gasses of the gaseous medium and the parameters of the discharge, selective and anisotropic etching is achieved. In most modern processes, a dry etch is performed wherein the wafer is exposed to a plasma, formed in the flow of one or more gasses. Typically, one or more halogenated compounds are used as an etchant gas. For example, $CF_4$, $CHF_3$ (freon 23) $SF_6$, $NF_3$, can be used. Added can be gases such as $O_2$, Ar, and $N_2$.

The contact hole 20 can typically be formed via anisotropic, RIE processing, using $CHF_3$ as an etchant, with said contact hole having an opening between about 0.3 to 0.5 um, in diameter, resulting in an aspect ratio of between about 1 and 3.

Figure 2:
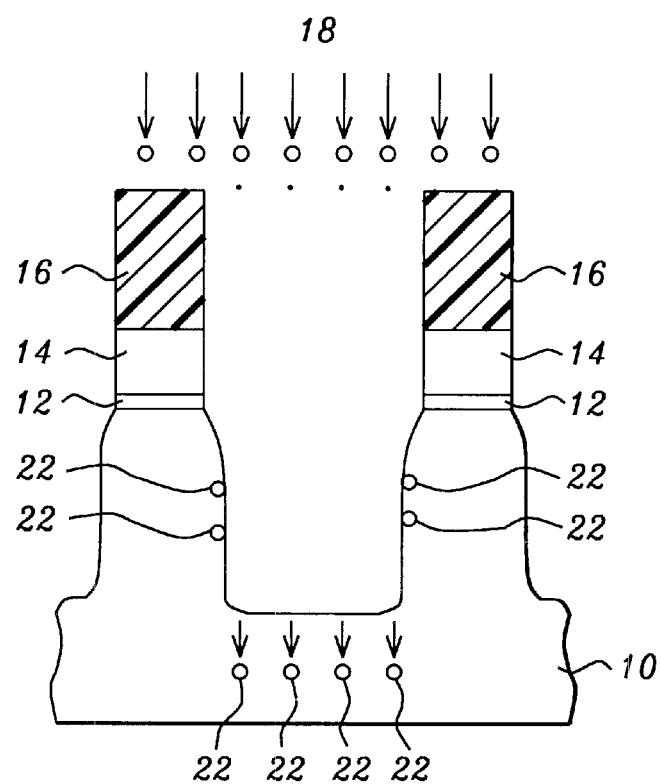

FIG. 2 shows a cross section of the STI opening while an oxygen implant 18 is performed. The oxygen implant into the silicon substrate can typically be performed at an energy of between about 20 to 50 keV and at a dose of between about 5E15 to 5E16 atoms/cm$^2$. It must be noted in FIG. 4 that the oxygen ions 22 that have been implanted into the substrate are concentrated at the inside of the sidewalls of the STI opening. This allows for a successful anneal of the silicone anted oxide during the following processing step.

Figure 3:
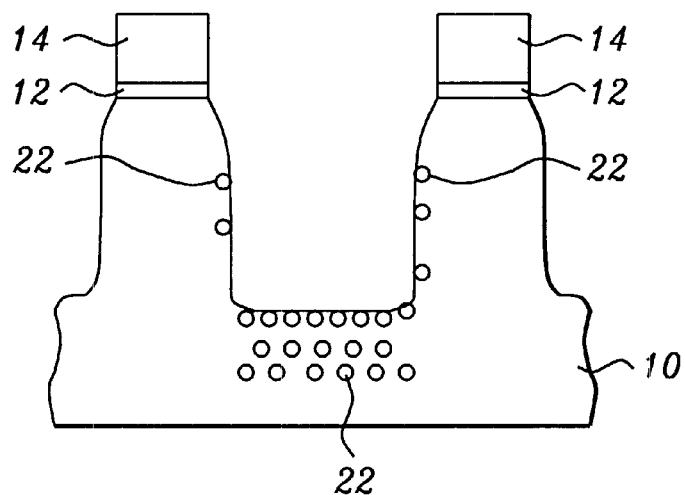

FIG. 3 shows a cross section of the STI trench after removal of the layer of patterned photoresist (layer 16, FIG. 2). The photoresist can be removed by heating it in a highly oxidized environment, such as an oxygen plasma, thereby converting it to an easily removed ash.

Figure 4:
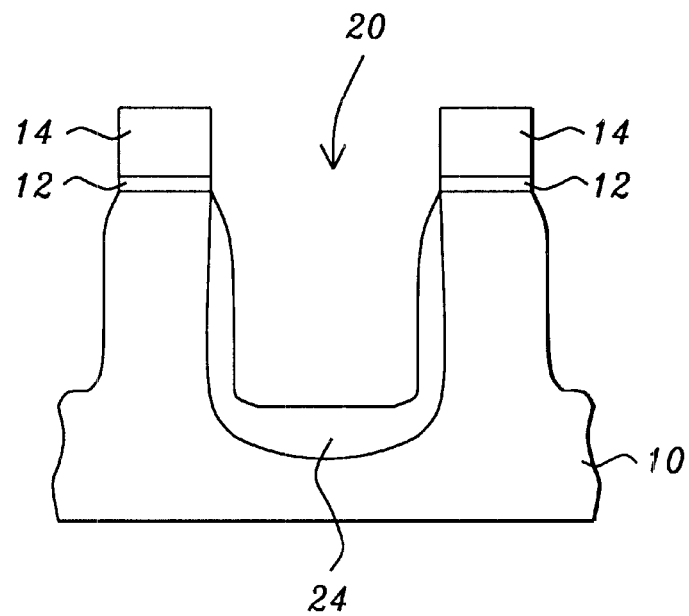

FIG. 4 shows a cross section of the STI opening 20 after the silicon implanted oxide (SIMOX) ions, that have now accumulated close to the surface of the sidewalls of the SIT opening, have been annealed. This process of annealing can be rapid thermal annealing in a temperature range of between about 800 and 1000 degrees C. for a time between about 20 and 40 seconds (used to activate the oxygen ion dopants), at a pressure below about $10^{-6}$ Torr. The process of annealing creates a highly concentrated layer 24 Of $SiO_2$ on the sidewalls of the SIT opening 20. It must be noted in FIG. 6 that the bottom of the opening 20 created in this manner is essentially created by the SIMOX procedure, the sidewalls of the opening 20 have essentially been created using the original processing sequences.

Figure 5:
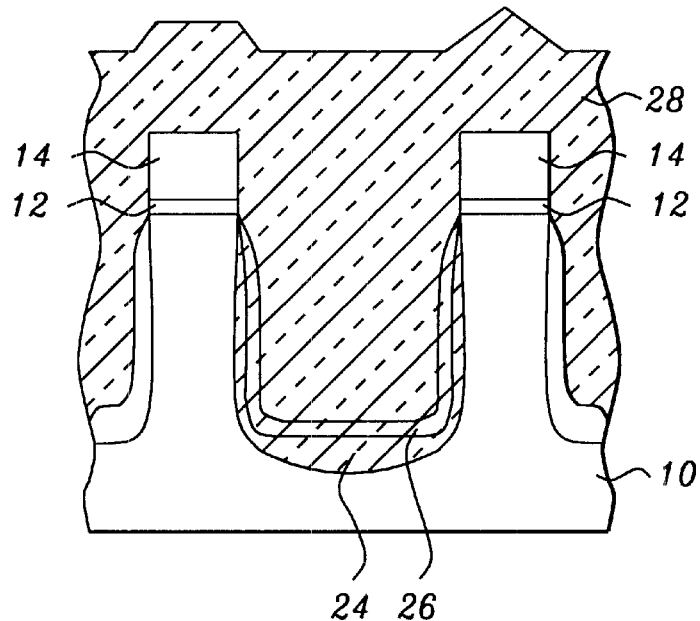

FIG. 5 shows a cross section of the STI opening after the growth of an oxide liner 26 and the blanket deposition of a layer 28 of HPD oxide. The oxide liner 26 of $SiO_2$ forms an insulator layer and is thermally grown in an oxygen steam ambient, at a temperature between about 850 and 1000 degrees C., to a thickness of about 50 to 200 Angstrom. The HPD oxide layer 28 is deposited using LPCVD or PECVD procedures, at a temperature between about 300 and 800 degrees C., to a thickness between about 5000 and 8000 Angstrom.

Figure 6:
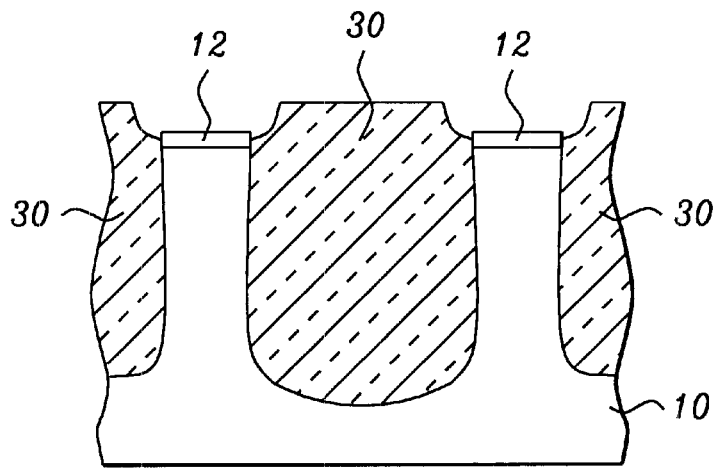

FIG. 6 shows a cross section of the final step in the creation of the STI opening under the invention. The layer of HDP is removed and the layer of silicon nitride is removed down to the surface of the layer of pad oxide. The final opening 30 for the STI is filled with the remaining HDP oxide.

Figure 7:
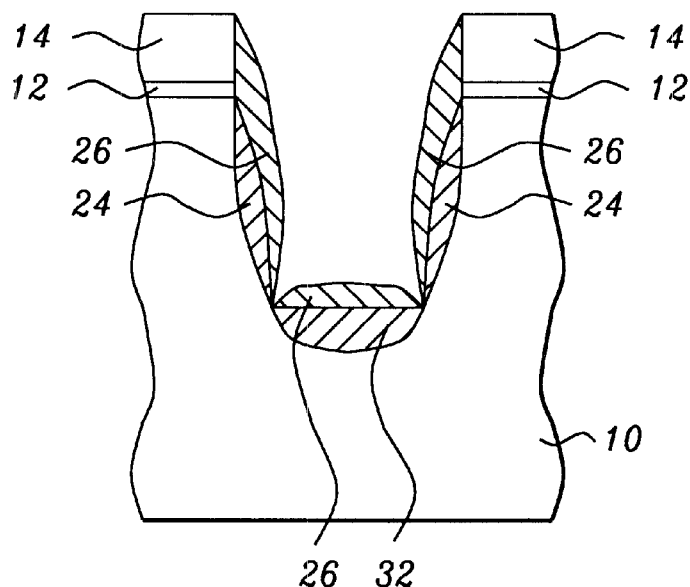
FIG. 7 shows a cross section of the STI with the formation of LOCOS on the bottom of the STI opening under the second embodiment of the invention. Also shown in FIG. 7 is the oxide liner oxide growth.

FIG. 7 addresses the second embodiment of the invention. It must be understood that the initial processing steps for the second embodiment of the invention are identical to the initial processing steps of the first embodiment of the invention as they have been shown in FIGS. 1 through 4. The discussion of the second embodiment of the invention that follows is therefore assumed to be preceded by the discussion of FIGS. 1 through 4 that is part of the first embodiment of the invention. The cross section that is shown in FIG. 4 therefore immediately precedes FIG. 7 of the second embodiment of the invention.

FIG. 7 shows a cross section of the STI whereby a LOCOS layer 32 has been formed on the bottom of the opening for the STI. The LOCOS region 32 can typically be formed by placing the wafer in an oxidation environment, generally in steam at a high temperature such as 1100 degrees C. The portions of the wafer not covered by the oxidation barrier oxidize to form thermal silicon thereat, with oxidation masked from the active regions by the oxidation barrier. The sidewalls of the opening 20 remain covered with the layer 24 of $SiO_2$.

FIG. 7 shows a cross section of the STI of the second embodiment of the invention after the layer 26 of oxide liner has been grown over the layer 32 of LOCOS and the layer 24 of $SiO_2$ on the sidewalls of opening 20.

The final phase of the creation of the STI under the second embodiment of the invention (not shown) is reached by the deposition of a layer of HDP oxide over the opening 20 and on top of the remaining layer 14 of silicon nitride, the removal (CMP) of the excess HPD oxide and the layer 14 of silicon nitride down to the top surface of the layer of gate oxide.

Figure 8:
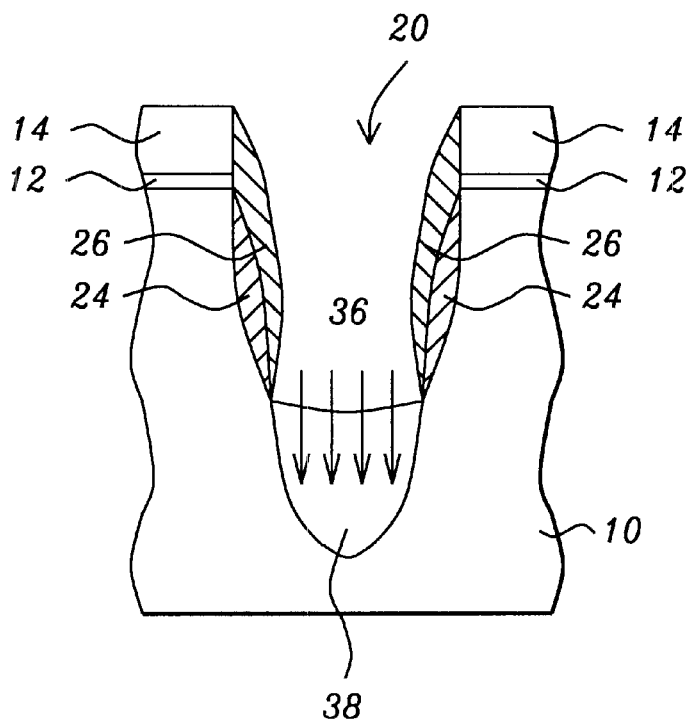
FIG. 8 shows a cross section of the STI with the bottom removed and after the oxide liner oxide growth.

FIG. 8 addresses the third embodiment of the invention. It must be understood that the initial processing steps for the third embodiment of the invention are identical to the initial processing steps of the first embodiment of the invention as they have been shown in FIGS. 1 through 4. The discussion of the third embodiment of the invention that follows is assumed to be preceded by the discussion of FIGS. 1 through 4 that is part of the first embodiment of the invention. The cross section that is shown in FIG. 4 therefore immediately precedes FIG. 8 of the third embodiment of the invention.

FIG. 8 shows a cross section of the STI after the trench etch 36 has been performed thereby removing the bottom section 38 of the STI opening 20. The layers 24 of $SiO_2$ that cover the sidewalls of opening 20 remain in place, the trench of the STI has been made considerably deeper by the indicated etch of the STI opening 20.

The final phase of the creation of the STI under the third embodiment of the invention (not shown) is reached by the growth of the liner oxide layer 26, the deposition of the HDP oxide and the removal (CMP) of the excess HPD oxide and the layer of silicon nitride down to the top surface of the layer of gate oxide.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming Shallow Trench Isolation regions in the surface of a silicon substrate, comprising:

providing a semiconductor substrate;

depositing a layer of pad oxide over the surface of said substrate;

depositing a layer of silicon nitride over the surface of said layer of pad oxide;

patterning and etching said layers of silicon nitride and pad oxide;

performing a tilt angle nitrogen implant into the surface of said substrate;

creating a Shallow Trench Isolation trench in the surface of said substrate whereby patterned layers of pad oxide, silicon nitride and photoresist remain on the surface of said substrate;

performing an oxygen atom implant into said substrate;

removing, said photoresist from the surface of said substrate;

performing an anneal of said implanted oxygen atoms thereby creating a layer of silicon dioxide on the sidewalls of said STI trench;

growing a oxide liner over said annealed oxygen;

blanket depositing a layer of HDP oxide over said oxide liner; and polishing the surface of said deposited layer of HDP oxide down to the top surface of said layer of gate oxide.

2. The method of claim 1 wherein said depositing a layer of pad oxide over the surface of said substrate is creating a layer of pad oxide to a thickness of about 110 Angstrom formed through a thermal oxidation method at a temperature of about 920 degrees C. for a time period of about 480 minutes whereby said layer of oxide is grown a thickness that is at least one third the thickness of the silicon nitride layer.

3. The method of claim 1 wherein said depositing a layer of silicon nitride over the surface of said layer of pad oxide is using LPCVD or PECVD procedures, at a temperature between about 200 and 800 degrees C., whereby said layer of silicon nitride is deposited to a thickness between about 200 and 5000 Angstrom.

4. The method of claim 1 wherein said patterning and etching said layers of silicon nitride and pad oxide is creating openings through said layers of silicon nitride and pad oxide down the surface of said substrate whereby said openings are above and aligned with the regions in the substrate where said STI regions are to be created.

5. The method of claim 1 wherein said performing a tilt angle nitrogen implant into the surface of said substrate is implanting nitrogen into the surface of said substrate said implant to be performed under an angle of between about 15 and 45 degrees with the plane of the surface of said substrate using an implant dose of between about 1E14 and 1E15 atoms/cm$^2$ and an energy between about 25 and 40 KeV.

6. The method of claim 1 wherein said creating a Shallow Trench Isolation trench in the surface of said substrate uses anisotropic RIE processing using $CHF_3$ as an etchant.

7. The method of claim 1 wherein said performing an oxygen atom implant into said substrate is implanting oxygen into the silicon substrate performed at an energy of between about 20 to 50 keV and at a dose of between about 5E15 to 5E16 atoms/cm$^2$.

8. The method of claim 1 wherein said removing said photoresist from the surface of said substrate is heating said substrate it in a highly oxidized environment, such as an oxygen plasma, thereby converting said photoresist to an easily removed ash.

9. The method of claim 1 wherein said anneal of said implanted oxygen atoms is a $N_2$ anneal performed at a temperature of between about 800 and 1000 degrees C. for a time between about 20 and 40 seconds at a pressure below about $10^{-6}$ Torr.

10. The method of claim 1 wherein said growing a oxide liner over said annealed oxygen is thermally growing said oxide liner in an oxygen steam ambient, at a temperature between about 850 and 1000 degrees C., to a thickness of about 50 to 200 Angstrom.

11. The method of claim 1 wherein said blanket depositing a layer of HDP oxide over, said oxide liner uses LPCVD or PECVD procedures, at a temperature between about 300 and 800 degrees C., to a thickness between about 5000 and 8000 Angstrom.

12. The method of claim 1 with the additional step of forming a layer of Local Oxidized Silicon (LOCOS) on the bottom of said STI region said step to be performed prior to said step of growing an oxide liner over said annealed oxygen.

13. The method of claim 1 with the additional step of etching the bottom of said STI region said step to be performed prior to said step of growing an oxide liner over said annealed oxygen.

14. A method of forming Shallow Trench Isolation regions in the surface of a silicon substrate, comprising:

providing a semiconductor substrate;

providing a semiconductor substrate;

depositing a layer of pad oxide over the surface of said substrate;

depositing a layer of silicon nitride over the surface of said layer of pad oxide;

patterning and etching said layers of silicon nitride and pad oxide thereby creating openings in said layers of silicon nitride and pad oxide down to the surface of said substrate whereby said openings overlay and align with the regions of said substrate where said STI regions are to be formed;

performing a tilt angle nitrogen implant into the surface of said substrate whereby said implant is performed under an angle of between about 15 and 45 degrees with the plane of the surface of said substrate with a dose of between about 1E14 and 1E15 atoms/cm$^2$ and an energy between about 25 and 40 KeV;

creating a Shallow Trench Isolation trench in said substrate whereby patterned layers of pad oxide, silicon nitride and photoresist remain on the surface of said substrate;

performing an oxygen atom implant into said substrate performed at an energy of between about 20 to 50 keV and at a dose of between about 5E15 to 5E16 atoms/cm$^2$;

removing said photoresist from the surface of said patterned layer of silicon nitride;

performing a N$_2$ anneal of said implanted oxygen atoms at a temperature of between about 800 and 1000 degrees C. for a time between about 20 and 40 seconds at a pressure below about 10$^{-6}$ Torr thereby creating a layer of silicon dioxide on the sidewalls of said STI trench;

thermally growing a oxide liner over said annealed oxygen in an oxygen steam ambient, at a temperature between about 850 and 1000 degrees C., to a thickness of about 50 to 200 Angstrom;

blanket depositing a layer of HDP oxide over said oxide liner; and polishing the surface of said deposited layer of HDP oxide down to the top surface of said layer of gate oxide.

15. A method of forming Shallow Trench Isolation regions in the surface of a silicon substrate, comprising:

providing a semiconductor substrate;

depositing a layer of pad oxide over the surface of said substrate;

depositing a layer of silicon nitride over the surface of said layer of pad oxide;

patterning and etching said layers of silicon nitride and pad oxide thereby creating openings in said layers of silicon nitride and pad oxide down to the surface of said substrate whereby said openings overlay and align with the regions of said substrate where said STI regions are to be formed;

performing a tilt angle nitrogen implant into the surface of said substrate whereby said implant is performed under an angle of between about 15 and 45 degrees with the plane of the surface of said substrate with a dose of between about 1E14 and 1E15 atoms/cm$^2$ and an energy between about 25 and 40 KeV;

creating a Shallow Trench Isolation trench in said substrate whereby patterned layers of pad oxide, silicon nitride and photoresist remain on the surface of said substrate;

performing an oxygen atom implant into said substrate performed at an energy of between about 20 to 50 keV and at a dose of between about 5E15 to 5E16 atoms/cm$^2$;

removing said photoresist from the surface of said patterned layer of silicon nitride;

performing a N$_2$ anneal of said implanted oxygen atoms at a temperature of between about 800 and 1000 degrees C. for a time between about 20 and 40 seconds at a pressure below about 10$^{-6}$ Torr thereby creating a layer of silicon dioxide on the sidewalls of said STI trench;

forming a layer of Local Oxidized Silicon (LOCOS) on the bottom of said STI;

thermally growing a oxide liner over said annealed oxygen in an oxygen steam ambient, at a temperature between about 850 and 1000 degrees C., to a thickness of about 50 to 200 Angstrom;

blanket depositing a layer of HDP oxide over said oxide liner; and polishing the surface of said deposited layer of HDP oxide down to the top surface of said layer of gate oxide.

16. A method of forming Shallow Trench Isolation regions in the surface of a silicon substrate, comprising:

providing a semiconductor substrate;

depositing a layer of pad oxide over the surface of said substrate;

depositing a layer of silicon nitride over the surface of said layer of pad oxide;

patterning and etching said layers of silicon nitride and pad oxide thereby creating openings in said layers of silicon nitride and pad oxide down to the surface of said substrate whereby said openings overlay and align with the regions of said substrate where said STI regions are to be formed;

performing a tilt angle nitrogen implant into the surface of said substrate whereby said implant is performed under an angle of between about 15 and 45 degrees with the plane of the surface of said substrate with a dose of between about 1E14 and 1E15 atoms/cm$^2$ and an energy between about 25 and 40 KeV;

creating a Shallow Trench Isolation trench in said substrate whereby patterned layers of pad oxide, silicon nitride and photoresist remain on the surface of said substrate;

performing an oxygen atom implant into said substrate performed at an energy of between about 20 to 50 keV and at a dose of between about 5E15 to 5E16 atoms/cm$^2$;

removing said photoresist from the surface of said patterned layer of silicon nitride;

performing a $N_2$ anneal of said implanted oxygen atoms at a temperature of between about 800 and 1000 degrees C. for a time between about 20 and 40 seconds at a pressure below about $10^{-6}$ Torr thereby creating a layer of silicon dioxide on the sidewalls of said STI trench;

etching the bottom of said STI opening;

thermally growing a oxide liner over said annealed oxygen in an oxygen steam ambient, at a temperature between about 850 and 1000 degrees C., to a thickness of about 50 to 200 Angstrom;

blanket depositing a layer of HDP oxide over said oxide liner; and polishing the surface of said deposited layer of HDP oxide down to the top surface of said layer of gate oxide.

* * * * *